(12) United States Patent
Jung et al.

(10) Patent No.: US 12,334,313 B2
(45) Date of Patent: Jun. 17, 2025

(54) PLASMA PROCESSING APPARATUS AND PLASMA PROCESSING METHOD

(71) Applicant: TOKYO ELECTRON LIMITED, Tokyo (JP)

(72) Inventors: Hwajun Jung, Hwaseong-si (KR); Mitsunori Ohata, Miyagi (JP); Yuki Hosaka, Miyagi (JP); Wan Sung Jin, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 332 days.

(21) Appl. No.: 17/696,280

(22) Filed: Mar. 16, 2022

(65) Prior Publication Data

US 2022/0301834 A1    Sep. 22, 2022

(30) Foreign Application Priority Data

Mar. 17, 2021 (JP) ................. 2021-043853

(51) Int. Cl.
*H01J 37/32* (2006.01)

(52) U.S. Cl.
CPC .... *H01J 37/32651* (2013.01); *H01J 37/3244* (2013.01); *H01J 37/32816* (2013.01); *H01J 2237/182* (2013.01); *H01J 2237/2007* (2013.01)

(58) Field of Classification Search
USPC .................................................. 156/345.26
See application file for complete search history.

(56) References Cited

U.S. PATENT DOCUMENTS

| | | | |
|---|---|---|---|
| 2001/0014540 A1* | 8/2001 | Shan ................. | H01J 37/32477 438/710 |
| 2001/0054383 A1* | 12/2001 | Pu ........................ | H01J 37/321 156/345.48 |
| 2012/0000886 A1* | 1/2012 | Honda .................. | H01J 37/18 156/345.1 |
| 2015/0060404 A1* | 3/2015 | Dhindsa ............ | H01J 37/32633 216/61 |
| 2015/0064924 A1* | 3/2015 | Takaba ................ | H01L 21/0276 438/717 |

(Continued)

FOREIGN PATENT DOCUMENTS

| | | |
|---|---|---|
| JP | 2012-015451 A | 1/2012 |
| JP | 2016-115848 A | 6/2016 |

(Continued)

*Primary Examiner* — Ram N Kackar
(74) *Attorney, Agent, or Firm* — XSENSUS LLP

(57) ABSTRACT

A plasma processing apparatus includes a plasma processing chamber, a substrate support disposed in the plasma processing chamber, an annular baffle plate disposed so as to surround the substrate support, the annular baffle plate having a plurality of openings, a first annular plate disposed below the annular baffle plate, a second annular plate disposed below the first annular plate, the second annular plate having an annular overlapping portion vertically overlapping with a part of the first annular plate, a pressure detector configured to detect a pressure in the plasma processing chamber, and at least one actuator configured to vertically move at least one of the first and second annular plates so as to change a distance between the first annular plate and the second annular plate based on the detected pressure.

15 Claims, 8 Drawing Sheets

(56) References Cited

U.S. PATENT DOCUMENTS

2016/0172217 A1* 6/2016 Miyata .............. H01J 37/32834
　　　　　　　　　　　　　　　　　　　　156/345.29
2019/0172689 A1* 6/2019 Nagaseki .......... H01L 21/67017

FOREIGN PATENT DOCUMENTS

| JP | 2019-102680 A | 6/2019 |
| JP | 2020-119962 A | 8/2020 |

* cited by examiner

PLASMA PROCESSING APPARATUS AND PLASMA PROCESSING METHOD

CROSS-REFERENCE TO RELATED APPLICATIONS

This application is based on and claims priority from Japanese Patent Application No. 2021-043853, filed on Mar. 17, 2021 with the Japan Patent Office, the disclosure of which is incorporated herein in its entirety by reference.

TECHNICAL FIELD

The present disclosure relates to a plasma processing apparatus and a plasma processing method.

BACKGROUND

Japanese Patent Laid-Open Publication No. 2012-015451 discloses a substrate processing apparatus including a processing chamber in which a plasma processing is performed on a substrate, an exhaust chamber communicating with the processing chamber, an exhaust plate having a plurality of first vent holes and separating the processing chamber and the exhaust chamber from each other, and an exhaust adjusting plate disposed in the exhaust chamber. According to the substrate processing apparatus described in Japanese Patent Laid-Open Publication No. 2012-015451, the exhaust adjusting plate has a plurality of second vent holes and is configured to be contactable with and separable from the exhaust plate in parallel to each other.

SUMMARY

An aspect of the present disclosure provides a plasma processing apparatus including a plasma processing chamber, a substrate support disposed in the plasma processing chamber, an annular baffle plate disposed so as to surround the substrate support, the annular baffle plate having a plurality of openings, a first annular plate disposed below the annular baffle plate, a second annular plate disposed below the first annular plate, the second annular plate having an annular overlapping portion vertically overlapping with a part of the first annular plate, a pressure detector configured to detect a pressure in the plasma processing chamber, and at least one actuator configured to vertically move at least one of the first and second annular plates so as to change a distance between the first annular plate and the second annular plate based on the detected pressure.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
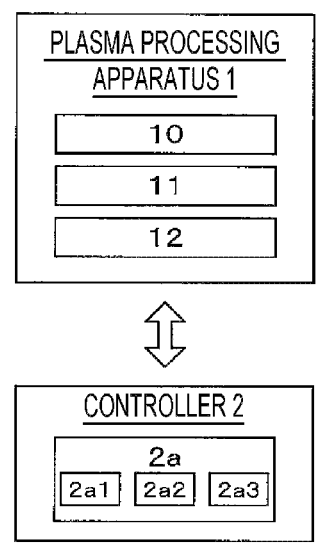
FIG. 1 is a schematic view schematically illustrating a configuration of a plasma processing system.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

In a process of manufacturing a semiconductor device, a processing gas is supplied to a semiconductor substrate (hereinafter, simply referred to as "substrate"), so that the substrate is subjected to various plasma processings such as an etching processing, a film forming processing, and a diffusion processing. These plasma processings are performed in a plasma processing apparatus having a processing chamber, the inside of which may be controlled to a decompressed atmosphere. In the plasma processing apparatus, it is important to precisely control the internal pressure of the processing chamber in order to appropriately perform the plasma processings on the substrate.

Japanese Patent Laid-Open Publication No. 2012-015451 discloses a substrate processing apparatus (plasma processing apparatus) including an exhaust plate configured to separate a processing chamber and an exhaust chamber from each other, and an exhaust adjusting plate configured to be contactable with and separable from the exhaust plate in parallel to each other in order to precisely control the internal pressure of the processing chamber. The exhaust plate and the exhaust adjusting plate are formed respectively with a plurality of vent holes perforated in the thickness direction. Then, the substrate processing apparatus described in Japanese Patent Laid-Open Publication No. 2012-015451 is configured to enable fine pressure adjustment at a relatively low pressure or at a relatively high pressure by adjusting the position of the exhaust adjusting plate with respect to the exhaust plate.

Meanwhile, in a recent process of manufacturing a semiconductor device, it is required to adjust an internal pressure of a processing chamber in a short time in response to a demand for miniaturization of patterns formed on a substrate surface. However, in the processing chamber in which a plasma processing is performed, it may be difficult to adjust the pressure in a short time because it requires, for example, a plasma gas or a large-capacity power supply. In particular, when the plasma processing apparatus has an inductively coupled plasma (ICP) generator, the capacity of the processing chamber is generally increased. Therefore, it has been great concern to adjust the internal pressure of the processing chamber in a short time.

The technique according to the present disclosure has been made in view of the above circumstances and provides a plasma processing apparatus capable of controlling the internal pressure of a processing chamber in a short time. Hereinafter, a plasma processing system having a plasma processing apparatus according to the present embodiment and a plasma processing method according to the embodiment will be described with reference to the drawings. In the present specification and the drawings, elements having substantially the same functional configurations will be designated by the same reference numerals, and thus, duplicate descriptions thereof will be omitted.

<Configuration of Plasma Processing System>

First, a plasma processing system according to an embodiment will be described. FIG. 1 is an explanatory view illustrating an outline of a configuration of a plasma processing system.

In an embodiment, the plasma processing system includes a plasma processing apparatus 1 and a controller 2 as illustrated in FIG. 1. The plasma processing apparatus 1 includes a plasma processing chamber 10, a substrate support 11, and a plasma generator 12.

The plasma processing chamber 10 has a plasma processing space. Further, the plasma processing chamber 10 has at least one gas inlet for supplying at least one processing gas to the plasma processing space and at least one gas outlet for discharging the gas from the plasma processing space. The gas inlet is connected to a gas supply 20 (to be described later), and the gas outlet is connected to an exhaust system 40 (to be described later). The substrate support 11 is disposed in the plasma processing space and has a substrate support surface for supporting a substrate.

The plasma generator 12 is configured to generate a plasma from at least one processing gas supplied into the plasma processing space. The plasma formed in the plasma processing space may be a capacitively coupled plasma (CCP), an inductively coupled plasma (ICP), an electron-cyclotron-resonance (ECR) plasma, a helicon wave excited plasma (HWP), or a surface wave plasma (SWP). Further, various types of plasma generators including an alternating current (AC) plasma generator and a direct current (DC) plasma generator may be used. In an embodiment, an AC signal (AC power) used in the AC plasma generator has a frequency in a range of 100 kHz to 10 GHz. Thus, the AC signal includes a radio frequency (RF) signal and a microwave signal. In an embodiment, the RF signal has a frequency in a range of 200 kHz to 150 MHz.

The controller 2 processes a computer executable instruction that causes the plasma processing apparatus 1 to execute various steps described in the present disclosure. The controller 2 may be configured to control each element of the plasma processing apparatus 1 so as to execute various steps described herein. In an embodiment, a part or all of the controller 2 may be included in the plasma processing apparatus 1. The controller 2 may include, for example, a computer 2a. The computer 2a may include, for example, a central processing unit (CPU) 2a1, a storage unit 2a2, and a communication interface 2a3. The processing unit 2a1 may be configured to perform various control operations based on programs stored in the storage unit 2a2. The storage unit 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

<Configuration of Plasma Processing Apparatus>

Figure 2:
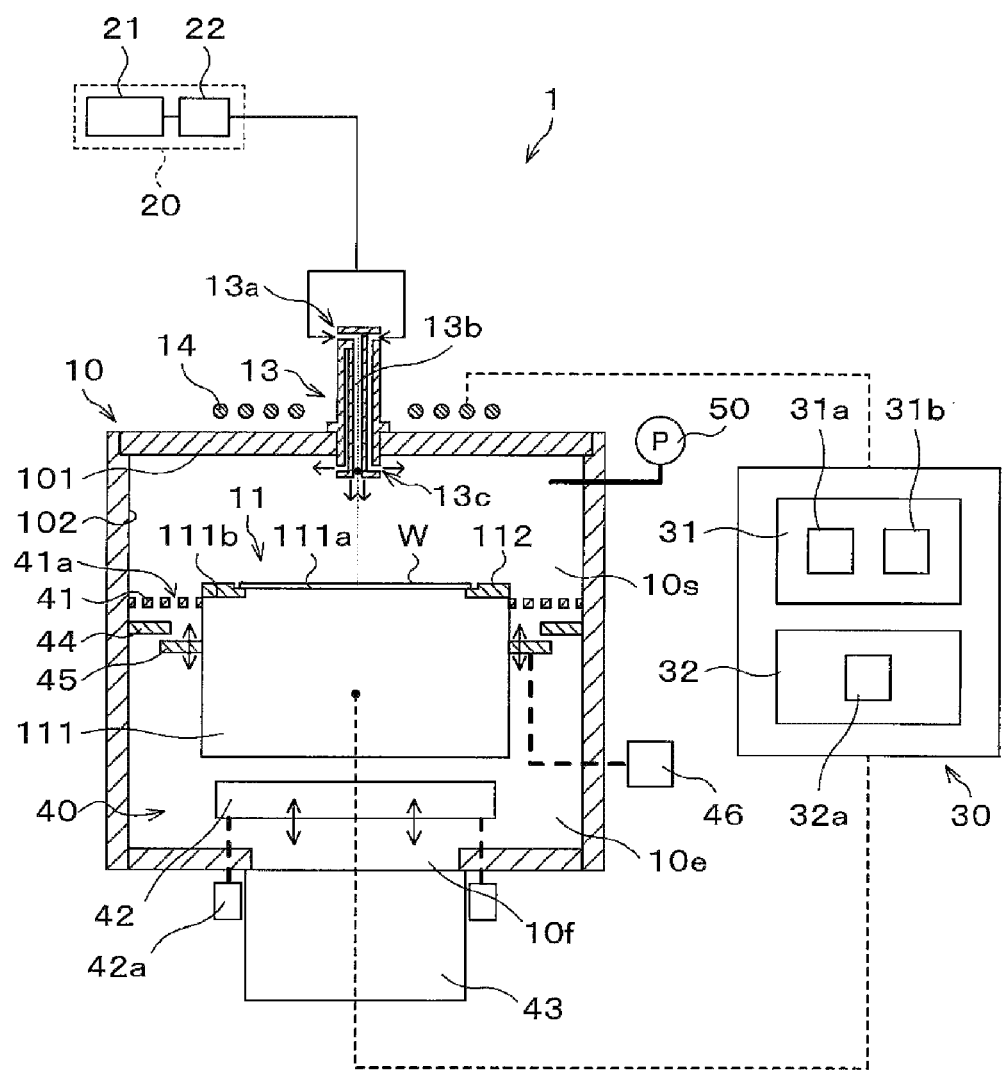
FIG. 2 is a vertical cross-sectional view schematically illustrating an example of a configuration of a plasma processing apparatus.

Hereinafter, a configuration example of an inductively coupled plasma (ICP) processing apparatus as an example of the plasma processing apparatus 1 will be described. FIG. 2 is a vertical cross-sectional view illustrating an outline of a configuration of the plasma processing apparatus 1.

The inductively coupled plasma processing apparatus 1 includes a plasma processing chamber 10, a gas supply 20, a power supply 30, the exhaust system 40, and a pressure measuring mechanism 50. The plasma processing chamber 10 includes a dielectric window 101. Further, the plasma processing apparatus 1 includes a substrate support 11, a gas introducing unit, and an antenna 14. The substrate support 11 is disposed in the plasma processing chamber 10. The antenna 14 is disposed over or above the plasma processing chamber 10 (i.e., over or above the dielectric window 101). The plasma processing chamber 10 has a plasma processing space 10s defined by the dielectric window 101, a sidewall 102 constituting the inner wall surface of the plasma processing chamber 10, and the substrate support 11. The plasma processing chamber 10 has at least one gas inlet for supplying at least one processing gas to the plasma processing space 10s and at least one gas outlet for discharging the gas from the plasma processing space 10s.

The substrate support 11 includes a main body 111 and a ring assembly 112. The main body 111 has a central region 111a (substrate support surface) for supporting a substrate (wafer) W and an annular region 111b (ring support surface) for supporting the ring assembly 112. The annular region 111b of the main body 111 surrounds the central region 111a of the main body 111 in a plan view. The substrate W is placed on the central region 111a, and the ring assembly 112 is placed on the annular region 111b so as to surround the substrate W on the central region 111a.

In an embodiment, the main body 111 includes a base (not illustrated) and an electrostatic chuck (not illustrated). The base includes a conductive member. The conductive member of the base functions as a lower electrode. The electrostatic chuck is placed on the base. The upper surface of the electrostatic chuck has the above-mentioned central region 111a and annular region 111b. The ring assembly 112 includes one or more annular members, at least one of which is an edge ring.

Further, although not illustrated, the substrate support 11 may include a temperature regulating module that regulates at least one of the electrostatic chuck, the ring assembly 112, and the substrate W to a target temperature. The temperature regulating module may include a heater, a heat transfer medium, a flow path, or a combination thereof. A heat transfer fluid such as brine or a gas flows through the flow path. Further, the substrate support 11 may include a heat transfer gas supply that supplies a heat transfer gas between the back surface of the substrate W and the substrate support surface.

The gas introducing unit is configured to introduce at least one processing gas from the gas supply 20 into the plasma processing space 10s. In an embodiment, the gas introducing unit includes a central gas injector (CGI) 13. The central gas injector 13 is disposed above the substrate support 11 and is attached to a central opening formed in the dielectric window 101. The central gas injector 13 has at least one gas supply port 13a, at least one gas flow path 13b, and at least one gas introduction port 13c. The processing gas supplied to the gas supply port 13a passes through the gas flow path 13b and is introduced into the plasma processing space 10s from the gas introduction port 13c. The gas introducing unit may include one or more side gas injectors (SGI) attached to one or more openings formed in the sidewall 102 in addition to or instead of the central gas injector 13.

The gas supply 20 may include at least one gas source 21 and at least one flow rate controller 22. In an embodiment, the gas supply 20 is configured to supply at least one processing gas from each corresponding gas source 21 to the central gas injector 13 via each corresponding flow rate controller 22. Each flow rate controller 22 may include, for example, a mass flow controller or a pressure-controlled flow rate controller. Moreover, the gas supply 20 may include one or more flow rate modulation devices that modulate or pulse the flow rate of at least one processing gas.

The power supply 30 includes an RF power supply 31 coupled to the plasma processing chamber 10 via at least one impedance matching circuit. The RF power supply 31 is configured to supply at least one RF signal (RF power) such as a source RF signal and a bias RF signal to a conductive member (lower electrode) of the substrate support 11 and the antenna 14. Thus, a plasma is formed from at least one processing gas supplied to the plasma processing space 10s. Thus, the RF power supply 31 may function as at least a part of a plasma generator that generates a plasma from one or more processing gases in the plasma processing chamber 10. Further, by supplying the bias RF signal to the lower electrode, a bias potential is generated in the substrate W, so that ions in the formed plasma may be drawn to the substrate W.

In an embodiment, the RF power supply 31 includes a first RF generator 31a and a second RF generator 31b. The first RF generator 31a is coupled to the antenna 14 via at least one impedance matching circuit and is configured to generate a source RF signal (source RF power) for plasma generation. In an embodiment, the source RF signal has a frequency in a range of 13 MHz to 150 MHz. In an embodiment, the first RF generator 31a may be configured to generate a plurality of source RF signals with different frequencies. One or more of the generated source RF signals are supplied to the antenna 14.

The second RF generator 31b is coupled to the lower electrode via at least one impedance matching circuit and is configured to generate a bias RF signal (bias RF power). In an embodiment, the bias RF signal has a lower frequency than the source RF signal. In an embodiment, the bias RF signal has a frequency in a range of 400 kHz to 13.56 MHz. In an embodiment, the second RF generator 31b may be configured to generate a plurality of bias RF signals with different frequencies. One or more of the generated bias RF signals are supplied to the lower electrode. Further, in various embodiments, at least one of the source RF signal and the bias RF signal may be pulsed.

Further, the power supply 30 may include a DC power supply 32 coupled to the plasma processing chamber 10. The DC power supply 32 includes a bias DC generator 32a. In an embodiment, the bias DC generator 32a is connected to the lower electrode and is configured to generate a bias DC signal. The generated bias DC signal is supplied to the lower electrode. In an embodiment, the bias DC signal may be supplied to another electrode such as an electrode in the electrostatic chuck. In various embodiments, the bias DC signal may be pulsed. The bias DC generator 32a may be provided in addition to the RF power supply 31, or may be provided instead of the second RF generator 31b.

The antenna 14 includes one or more coils. In an embodiment, the antenna 14 may include an outer coil and an inner coil which are coaxially arranged. In this case, the RF power supply 31 may be connected to both the outer and inner coils, or may be connected to either the outer coil or the inner coil. In the former case, the same RF generator may be connected to both the outer and inner coils, or separate RF generators may be connected separately to the outer and inner coils.

The exhaust system 40 exhausts and decompresses the inside of the plasma processing chamber 10 (plasma processing space 10s) via an exhaust path 10e formed around the substrate support 11 in a plan view and via a gas discharge port 10f formed in the bottom surface of the plasma processing chamber 10. The exhaust system 40 includes an annular baffle plate 41 that separates the plasma processing space 10s and the exhaust path 10e from each other, a pressure adjusting valve 42 that opens and closes the gas discharge port 10f by an operation of a moving mechanism 42a, and an exhaust mechanism 43 that exhausts the inside of the plasma processing space 10s via the pressure adjusting valve 42. Further, in the present embodiment, an upper plate 44, a lower plate 45, and a moving mechanism 46 are disposed on the downstream side of the annular baffle plate 41 in the exhaust path 10e to adjust the internal pressure of the plasma processing space 10s in a short time. A detailed configuration of the exhaust system 40 will be described later.

The pressure measuring mechanism (pressure detector) 50 measures the internal pressure of the plasma processing chamber 10 (plasma processing space 10s) during a plasma processing. The type of the pressure measuring mechanism 50 is not particularly limited and may be arbitrarily determined as long as the internal pressure of the plasma processing chamber 10 may be measured. In an embodiment, the pressure measuring mechanism 50 includes a pressure detector that detects the pressure in the plasma processing chamber 10.

Although various embodiments have been described above, various additions, omissions, substitutions, and changes may be made without being limited to the above-mentioned embodiments. Further, elements in different embodiments may be combined to create other embodiments.

<Configuration of Exhaust System>

Figure 3:
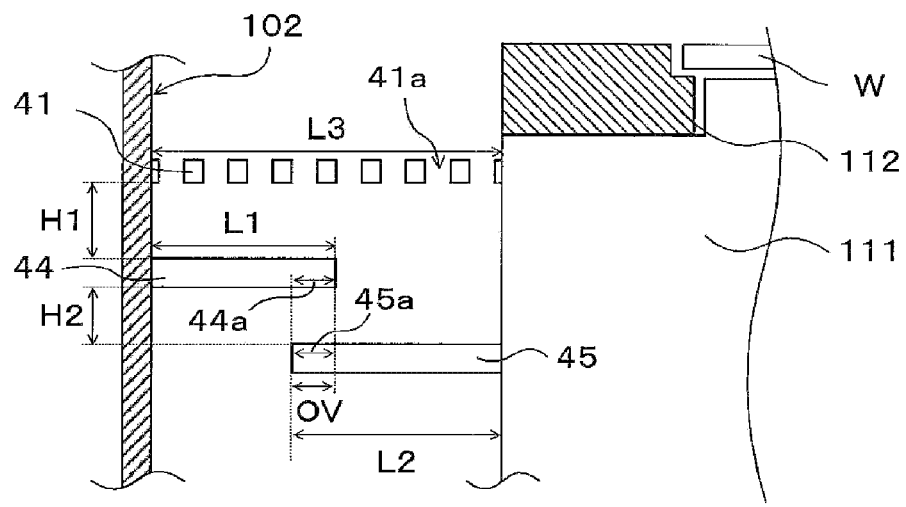
FIG. 3 is a major part enlarged view illustrating a configuration example of a major part of an exhaust system in an enlarged scale.
Figure 4:
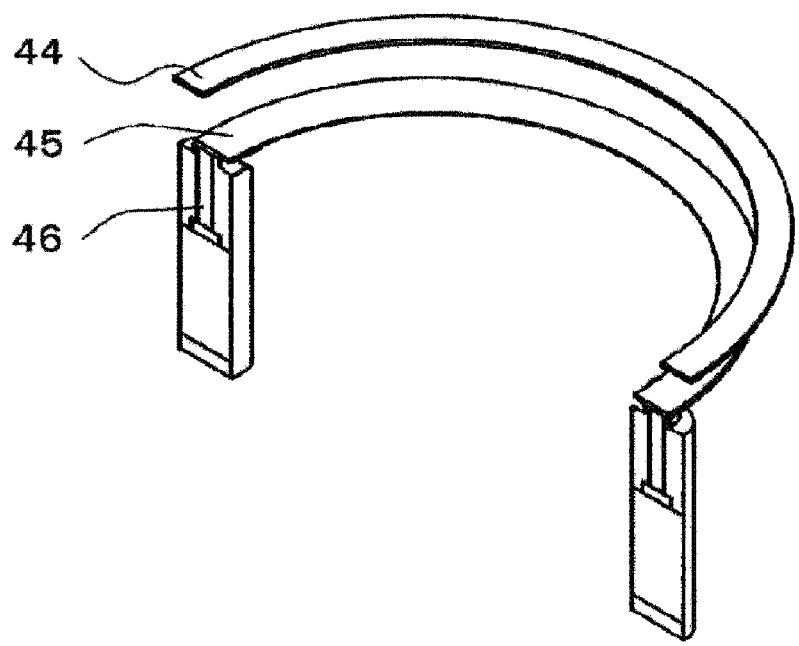
FIG. 4 is a perspective cross-sectional view illustrating an outline of a configuration example of the exhaust system.

Next, an example of a detailed configuration of the above-described exhaust system 40 will be described. FIG. 3 is a major part enlarged view illustrating a major part of the exhaust system 40 in an enlarged scale. FIG. 4 is a perspective cross-sectional view schematically illustrating a major part of the exhaust system 40.

As described above, the exhaust system 40 includes the annular baffle plate 41, the pressure adjusting valve 42, the exhaust mechanism 43, the upper plate 44, the lower plate 45, and the moving mechanism 46.

The annular baffle plate 41 is disposed around the substrate support 11 in a plan view so as to separate the plasma processing space 10s and the exhaust path 10e from each other. The annular baffle plate 41 is an annular plate-shaped member having a large number of through-holes (openings) 41a, communicates the plasma processing space 10s with the exhaust path 10e through the through-holes, and captures or reflects a plasma generated in the plasma processing space 10s to suppress leakage of the plasma to the exhaust path 10e. Further, the annular baffle plate 41 is disposed in parallel to the substrate W placed on the substrate support 11 and is located at a position lower than the upper surface of the substrate W, more specifically, the substrate support surface in the drawing. Thus, the annular baffle plate 41 is horizontally disposed so as to surround the sidewall of the substrate support 11, and has the openings 41a formed so as to vertically penetrate the annular baffle plate 41.

The pressure adjusting valve 42 adjusts an operation of decompressing the plasma processing space 10s, i.e., the internal pressure (decompression degree) of the plasma processing chamber 10 performed by the exhaust mechanism 43 as the pressure adjusting valve 42 is opened and closed. For example, an APC valve or a poppet valve may be selected as the pressure adjusting valve 42.

The exhaust mechanism 43 decompresses the inside of the plasma processing space 10s. The exhaust mechanism 43 may include, for example, a vacuum pump such as a turbo molecular pump or a dry pump, or a combination thereof.

For example, the upper plate (first annular plate) 44 is fixedly disposed with respect to the sidewall 102 of the plasma processing chamber 10 on the downstream side of the annular baffle plate 41 in the exhaust path 10e. Thus, the first annular plate 44 is disposed below the annular baffle plate 41. In an embodiment, the first annular plate 44 completely vertically overlaps with the annular baffle plate 41. The upper plate 44 is an annular plate-shaped member and is formed such that the width L1 (see FIG. 3) of an annular portion is smaller than the width L3 (see FIG. 3) of the annular baffle plate 41. In other words, an exhaust flow path having a width [L3−L1] is formed between the inner end of the upper plate 44 and a side surface portion of the substrate support 11. The width L1 of the upper plate 44 may be arbitrarily designed.

A distance H1 between the annular baffle plate 41 and the upper plate 44 (see FIG. 3) may also be arbitrarily designed. However, for example, from the viewpoint of appropriately adjusting the exhaust conductance, the distance H1 may be at least 40 mm or more.

For example, the lower plate (second annular plate) 45 is disposed on the side surface portion of the substrate support 11 on the downstream side of the upper plate 44 in the exhaust path 10e. Thus, the second annular plate 45 is disposed below the first annular plate 44. In an embodiment, the second annular plate 45 completely vertically overlaps the annular baffle plate 41. In an embodiment, the first annular plate 44 is fixed to the sidewall of the plasma processing chamber 10 and in this case, the second annular plate 45 is vertically movable and is disposed on or near the sidewall of the substrate support 11. The lower plate 45 is an annular plate-shaped member, and is formed such that the width L2 of an annular portion (see FIG. 3) is smaller than the width L3 of the annular baffle plate 41. In other words, an exhaust flow path having a width [L3−L2] is formed between the outer end of the lower plate 45 and the sidewall 102 of the plasma processing chamber 10. The width L2 of the lower plate 45 may be arbitrarily designed.

Further, the first annular plate 44 and the second annular plate 45 do not have a plurality of vertically penetrating openings like those in the annular baffle plate 41. Thus, each of the openings 41a in the annular baffle plate 41 is shielded by at least one of the first and second annular plates 44 and 45 in a plan view. That is, each opening 41a in the annular baffle plate 41 may be selectively shielded by the first annular plate 44 or the second annular plate 45 in a plan view, or may be shielded by both the first and second annular plates 44 and 45 in a plan view. Thus, the space below the second annular plate 45 is invisible when viewed vertically from above the openings 41a.

Further, in the present embodiment, the lower plate 45 is configured to be movable in the perspective direction (vertical direction in the illustrated example) with respect to the upper plate 44 by an operation of the moving mechanism 46 such as, for example, an actuator. In other words, the lower plate 45 is configured such that a distance H2 between the lower plate 45 and the upper plate 44 (see FIG. 3) may be arbitrarily adjusted. An operation of the moving mechanism 46 is controlled by, for example, the controller 2. The adjustment range of the distance H2 may be arbitrarily designed, but the distance H2 may be adjustable at least between 5 mm and 50 mm from the viewpoint of appropriately controlling the pressure in the plasma processing space 10s. Thus, at least one actuator 46 is configured to vertically move only the second annular plate 45 based on the pressure detected by the pressure detector 50. That is, at least one actuator 46 is configured to vertically move the second annular plate 45 without moving the first annular plate 44. That is, the first annular plate 44 functions as a stationary annular plate, and the second annular plate 45 functions as a movable annular plate. Thus, the distance H2 between the first annular plate 44 and the second annular plate 45 is changed.

Figure 5:
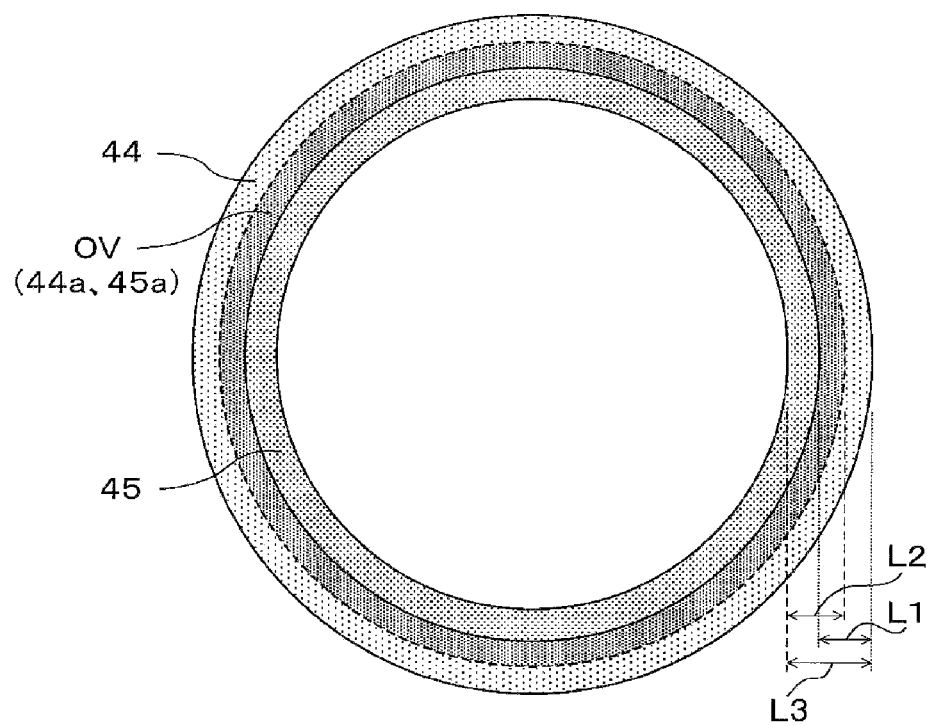
FIG. 5 is a plan view illustrating an arrangement example of the exhaust system.

Here, as illustrated in FIGS. 3 and 5, the upper plate 44 and the lower plate 45 according to the present embodiment are arranged so as to form an overlapping portion (annular overlapping portion) OV where at least a part thereof in the radial direction overlap with respect to the exhaust direction (vertical direction in the illustrated example) in the exhaust path 10e. In other words, the respective widths L1 and L2 of the upper and lower plates 44 and 45 are determined so as to form the overlapping portion OV illustrated in FIGS. 3 and 5 (L3<L1+L2). The width of the overlapping portion OV may be arbitrarily designed, but may be designed to be in a range of, for example, 5 mm to 10 mm. In an embodiment, the second annular plate 45 is disposed below the first annular plate 44 and has a second annular overlapping portion 45a. The second annular overlapping portion 45a vertically overlaps with a part of the first annular plate 44 (i.e., a first annular overlapping portion 44a). Thus, the annular overlapping portion OV of the upper and lower plates 44 and 45 is a portion where a part of the second annular plate 45 (i.e., the second annular overlapping portion 45a) and a part of the first annular plate 44 (i.e., the first annular overlapping portion 44) vertically overlap each other.

Further, at this time, a magnitude relation between the width L1 of the upper plate 44 and the width L2 of the lower plate 45 is not particularly limited. For example, either the width L1 or the width L2 may be larger, or the width L1 and the width L2 may be the same. However, from the viewpoint of appropriately adjusting the exhaust conductance, the width L1 may be smaller than the width L2 (L1<L2).

The exhaust system 40 included in the plasma processing apparatus 1 according to the present embodiment is configured as described above.

Here, in a plasma processing performed by using a conventional plasma processing apparatus 1, it is required to perform the supply of a processing gas or the exhaust by the exhaust system 40 with respect to the entire inside of the plasma processing chamber 10 including the plasma processing space 10s and the exhaust path 10e, which results in a need for a great deal of time for the pressure control of the plasma processing chamber 10 (plasma processing space 10s).

In this respect, in the present embodiment, as described above, the upper and lower plates 44 and 45 forming the overlapping portion OV in at least a part thereof in the radial direction are arranged in the exhaust path 10e, and the lower plate 45 is configured to be movable in the perspective direction with respect to the upper plate 44. Further, these upper and lower plates 44 and 45 have no through-holes (openings) formed therein. Therefore, the upper and lower plates 44 and 45 act similarly to a second pressure adjusting valve by reducing the distance H2.

In other words, by reducing the distance H2 between the upper plate 44 and the lower plate 45, the exhaust path 10e on the downstream side of the lower plate 45 is separated from the plasma processing space 10s, so that the volume of the plasma processing chamber 10 may be reduced likewise. Then, since the volume of the plasma processing chamber 10 is reduced in this way, the time required for the pressure control of the plasma processing space 10s may be shortened.

Further, according to the present embodiment, as described above, the lower plate 45 is configured to be movable in the perspective direction with respect to the upper plate 44. Thus, the amount of exhaust from the plasma processing space 10s by the exhaust mechanism 43 may be arbitrarily adjusted, so that the internal pressure of the plasma processing space 10s may be precisely controlled. That is, since the amount of exhaust from the plasma processing space 10s is changed according to the magnitude of the distance H2 between the upper plate 44 and the lower plate 45, the internal pressure of the plasma processing space 10s may be appropriately controlled by adjusting the distance H2 based on, for example, the measurement result by the pressure measuring mechanism 50.

Specifically, for example, when the internal pressure of the plasma processing space 10s is lower than a set pressure, the amount of exhaust is reduced by raising the lower plate 45 to reduce the distance H2, and therefore, the internal pressure of the plasma processing space 10s may be raised. Further, for example, when the internal pressure of the plasma processing space 10s is higher than the set pressure, the amount of exhaust is increased by lowering the lower plate 45 to increase the distance H2, and therefore, the internal pressure of the plasma processing space 10s may be reduced.

Further, at this time, in addition to the upper and lower plates 44 and 45 functioning as the second pressure regulating valve, the pressure adjusting valve 42 disposed at the bottom of the plasma processing chamber 10 is used to adjust the exhaust from the plasma processing space 10s in two stages, whereby the internal pressure of the plasma processing space 10s may be controlled more precisely.

As described above, with the plasma processing apparatus 1 according to the present embodiment, by providing the exhaust system 40 with the upper and lower plates 44 and 45 functioning as the second pressure adjusting valve, the internal pressure of the plasma processing space 10s may be precisely controlled, and the time required for the pressure control may be appropriately shortened.

However, as a result of diligent studies on the above-described embodiments, the present inventors have found that there is a possibility of a change in the internal pressure of the plasma processing space 10s being excessively increased (steeply increased), especially when the distance H2 between the upper plate 44 and the lower plate 45 is small. Then, when the change in the internal pressure is excessively increased (steeply increased) in this way, there is a possibility that a plasma processing for the substrate W may not be appropriately executed due to such a change in the pressure.

Second Embodiment

Figure 6:
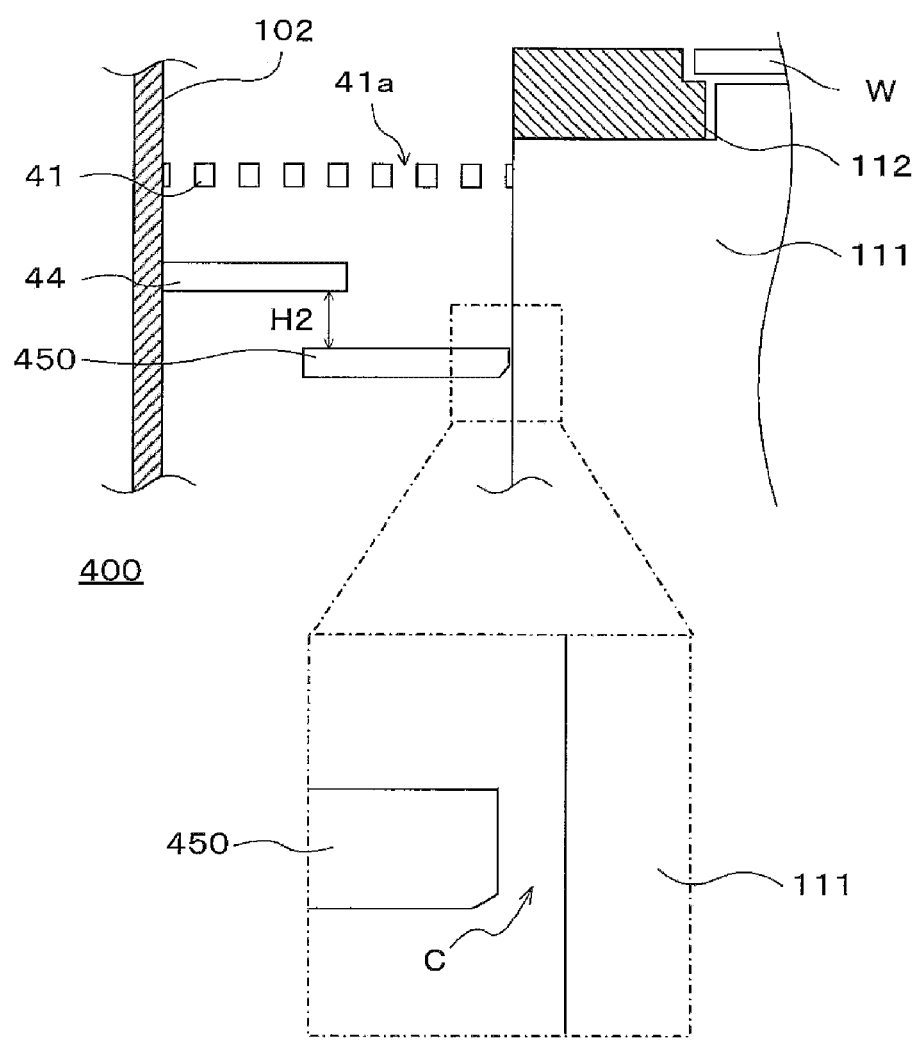
FIG. 6 is a major part enlarged view illustrating another configuration example of the exhaust system in an enlarged scale.

FIG. 6 is a major part enlarged view schematically illustrating a configuration of an exhaust system 400 according to a second embodiment for suppressing a steep change in the internal pressure of the plasma processing space 10s. In the drawing, elements having the same functional configuration as the above-described exhaust system 40 will be designated by the same reference numerals, and thus, detailed descriptions thereof will be omitted.

As illustrated in FIG. 6, the exhaust system 400 according to the second embodiment includes the annular baffle plate 41, the upper plate 44, a lower plate 450 and the moving mechanism 46 (not illustrated in FIG. 6).

For example, the upper plate 44 is fixedly disposed with respect to the sidewall 102 of the plasma processing chamber 10 on the downstream side of the annular baffle plate 41 in the exhaust path 10e.

For example, the lower plate 450 is disposed at the side surface portion side of the substrate support 11 on the downstream side of the upper plate 44 in the exhaust path 10e. Further, the lower plate 450 is configured to be movable in the perspective direction (vertical direction in the illustrated example) with respect to the upper plate 44 by an operation of the moving mechanism 46 (not illustrated).

Further, in the present embodiment, the lower plate 450 is slightly spaced apart from the substrate support 11 such that a gap C as a bypass flow path is formed between the lower plate 450 and the side surface portion of the substrate support 11 (main body 111) as illustrated in FIG. 6. That is, the second annular plate 450 and the substrate support 11 are concentrically arranged, and the second annular plate 450 has an inner diameter larger than the outer diameter of the substrate support 11. Thus, the annular gap C is formed between the inner peripheral edge portion of the second annular plate 450 and the sidewall of the substrate support 11. The width of the gap C is a size by which the gap may constantly create an exhaust flow from the plasma processing space 10s by the exhaust mechanism 43 and does not affect the internal pressure of the plasma processing space 10s during a plasma processing, and is preferably 1.0 mm or less and, more preferably, 0.5 mm or less. In an embodiment, the annular gap C has the same width over the entire circumference.

Figure 7:
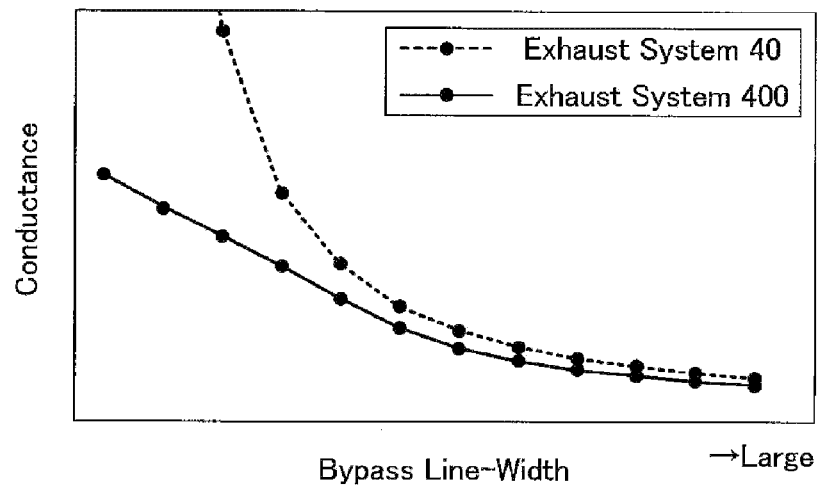
FIG. 7 is an explanatory view illustrating an example of a relation between a spacing in the exhaust system and the internal pressure of a plasma processing chamber.

In this way, with the exhaust system 400 according to the second embodiment, in addition to the exhaust from the distance H2 between the upper plate 44 and the lower plate 450, the minute constant exhaust of the plasma processing space 10s from the gap C formed between the inner end of the lower plate 45 and the side surface portion of the substrate support 11 is further performed. Thus, as illustrated in FIG. 7, even when the distance H2 between the upper plate 44 and the lower plate 450 is reduced, the internal pressure (an exhaust conductance value in the example of FIG. 7) of the plasma processing space 10s is suppressed from being excessively (steeply) changed as in the exhaust system 40 according to the first embodiment, and that is, a plasma processing for the substrate W may be appropriately executed.

In particular, according to the present embodiment, the width of the gap C is set to a size by which the gap does not affect the internal pressure of the plasma processing space 10s during a plasma processing, preferably 1.0 mm or less. Therefore, a steep change in the internal pressure is also suppressed by the constant exhaust from the gap C during a plasma processing.

In the second embodiment described above, the bypass flow path is formed to perform the constant exhaust of the plasma processing space 10*s* by forming the gap C between the inner end of the lower plate 450 and the side surface portion of the substrate support 11, but a method of forming the bypass flow path is not limited thereto. Specifically, for example, the bypass flow path may be formed by forming one or more slits (notches) along the side surface portion of the substrate support 11 in the inner end of the lower plate 450. Alternatively, for example, one or more slits (notches) may be formed along the inner end of the lower plate 450 in the side surface portion of the substrate support 11 instead of the inner end of the lower plate 450.

Further, the gap C may be formed between the upper plate 44 and the sidewall 102 of the plasma processing chamber 10 in addition to or instead of between the inner end of the lower plate 450 and the side surface portion of the substrate support 11.

The exhaust system 400 included in the plasma processing apparatus 1 according to the second embodiment may be configured as described above.

Modifications

Figure 8:
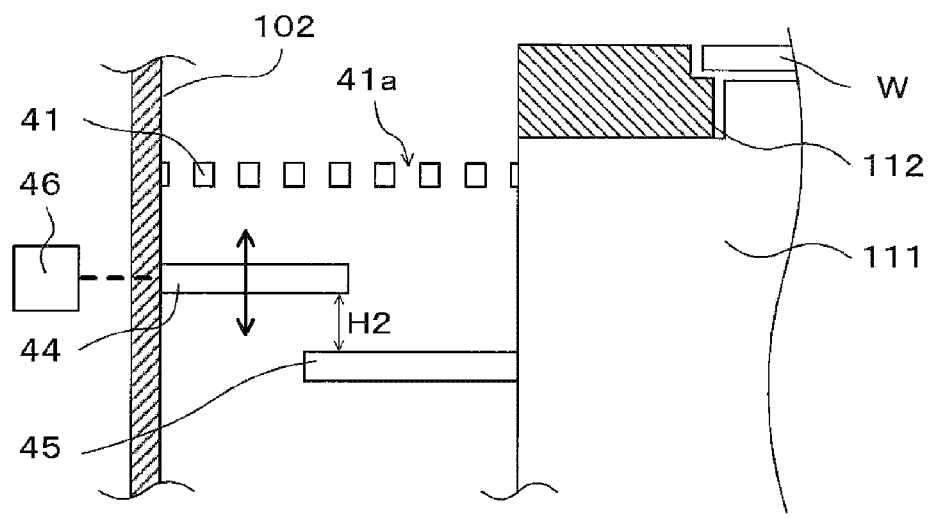
FIG. 8 is a major part enlarged view illustrating a modification of the exhaust system.

In the above-described embodiments, the exhaust system has been configured such that the position of the upper plate 44 is fixed with respect to the position of the annular baffle plate 41 and the lower plate 45 may be moved in the perspective direction (vertical direction) with respect to the position of the upper plate 44, but a configuration of the exhaust system is not limited thereto. That is, for example, as illustrated in FIG. 8, the exhaust system may be configured such that the lower plate 45 is fixed with respect to the position of the annular baffle plate 41 and the upper plate 44 may be moved between the annular baffle plate 41 and the lower plate 45. In other words, the upper plate 44 may be configured to be movable in the perspective direction with respect to the lower plate 45. Thus, at least one actuator 46 is configured to vertically move only the first annular plate 44 based on the pressure detected by the pressure detector 50. That is, at least one actuator 46 is configured to vertically move the first annular plate 44 without moving the second annular plate 45. Thus, the distance H2 between the first annular plate 44 and the second annular plate 45 is changed. Even in such a case, by adjusting the distance H2 between the upper plate 44 and the lower plate 45 based on the measurement result by the pressure measuring mechanism 50, the internal pressure of the plasma processing space 10*s* may be precisely controlled, and the time required for the pressure control may be appropriately shortened.

Figure 9:
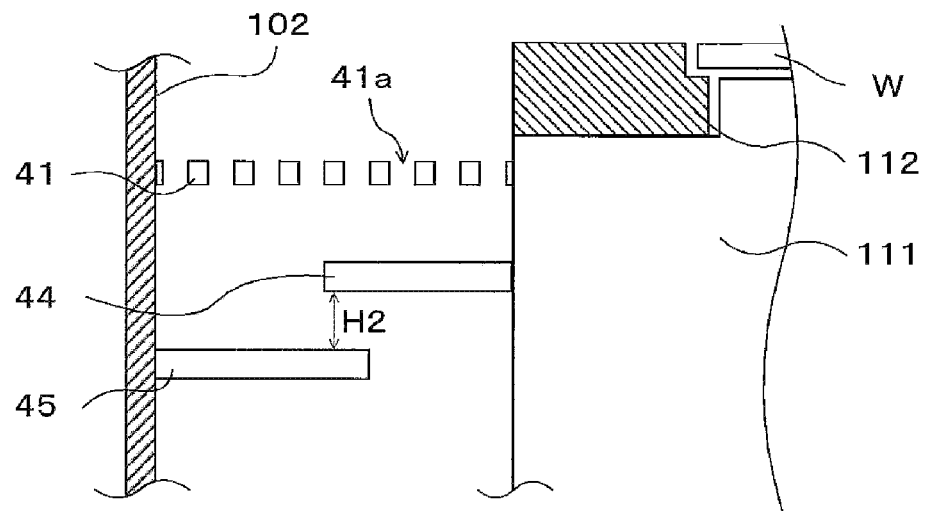
FIG. 9 is a major part enlarged view illustrating a modification of the exhaust system.

In the above-described embodiments, the upper plate 44 is disposed at the sidewall 102 side of the plasma processing chamber 10 and the lower plate 45 is disposed at the side surface portion side of the substrate support 11, but the arrangement of the two annular plates is not limited thereto. That is, for example, as illustrated in FIG. 9, the upper plate 44 may be disposed at the side surface portion side of the substrate support 11, and the lower plate 45 may be disposed at the sidewall 102 side of the plasma processing chamber 10. Even in such a case, by adjusting the distance H2 between the upper plate 44 and the lower plate 45 based on the measurement result by the pressure measuring mechanism 50, the internal pressure of the plasma processing space 10*s* may be precisely controlled, and the time required for the pressure control may be appropriately shortened. Thus, the first annular plate 44 may be fixed to the sidewall of the substrate support 11, and in this case, the second annular plate 45 is disposed on or near the sidewall of the plasma processing chamber 10.

Further, when the lower plate 45 is disposed at the sidewall 102 side of the plasma processing chamber 10 in this way, the gap C or the slit (notch) as the bypass flow path illustrated in the second embodiment may be formed between the outer end of the lower plate 45 and the sidewall 102 of the plasma processing chamber 10.

In the above-described embodiment, a case where the upper plate 44 and the lower plate 45 are disposed vertically side by side just below the downstream side of the annular baffle plate 41 has been described as an example, but the installation positions of the upper and lower plates 44 and 45 are not limited thereto. That is, if the upper and lower plates 44 and 45 may be installed on the downstream side of the annular baffle plate 41 and at least on the upstream side of the pressure adjusting valve 42, the volume of the plasma processing chamber 10 may be reduced likewise at least as compared with the related art, and therefore, the time required for controlling the internal pressure of the plasma processing space 10*s* may be shortened. Thus, at least one actuator 46 is configured to vertically move both the first and second annular plates 44 and 45 based on the pressure detected by the pressure detector 50. Thus, the distance H2 between the first annular plate 44 and the second annular plate 45 is changed. The at least one actuator 46 may be one actuator or a plurality of actuators. In the latter case, the at least one actuator 46 includes a first actuator that moves the first annular plate 44 and a second actuator that moves the second annular plate 45.

<Plasma Processing Method>

Next, a plasma processing method using the plasma processing system configured as described above will be described. In the plasma processing apparatus 1, the substrate W is subjected to an arbitrary plasma processing such as an etching processing, a film formation processing, or a diffusion processing.

In the plasma processing, first, the substrate W is transferred into the plasma processing chamber 10, so that the substrate W is placed on the substrate support 11. After that, by supplying a DC voltage to the electrode in the electrostatic chuck, the substrate W is adsorbed and held by the electrostatic chuck by a coulomb force. Further, after the substrate W is transferred into the plasma processing chamber 10, the inside of the plasma processing chamber 10 is depressurized to a desired degree of vacuum by the exhaust system 40.

Next, a processing gas is supplied from the gas supply 20 to the plasma processing space 10*s* via the central gas injector 13. Further, a radio-frequency power HF for plasma generation is supplied to the antenna 14 by the first RF generator 31*a*, so that a plasma is generated from the processing gas in the plasma processing space 10*s*. Then, a desired plasma processing is performed on the substrate W placed on the substrate support 11 by the action of the generated plasma. That is, the plasma processing is performed on the substrate W by exposing the substrate W to the generated plasma. The pressure (internal pressure) in the plasma processing chamber 10 during the plasma processing is measured (detected) over time by the pressure measuring mechanism 50.

Here, the internal pressure of the plasma processing chamber 10 is adjusted to a desired set pressure by supplying the processing gas to the plasma processing space 10*s*. At this time, since the upper and lower plates 44 and 45 act as the second pressure adjusting valve by reducing the distance H2 between the upper plate 44 and the lower plate 45 as described above, the volume of the plasma processing chamber 10 may be reduced likewise, whereby the internal pressure of the plasma processing chamber 10 may be controlled in a short time.

Further, as described above, in the plasma processing apparatus, it is important to precisely control the internal pressure of the plasma processing chamber 10 in order to appropriately perform the plasma processing on the substrate W. Therefore, in the present embodiment, the distance H2 between the upper plate 44 and the lower plate 45 in the exhaust system 40 is controlled based on the internal pressure of the plasma processing chamber 10 measured by the pressure measuring mechanism 50. Specifically, when the measurement result by the pressure measuring mechanism 50 is lower than the set pressure of the plasma processing, the internal pressure of the plasma processing chamber 10 is raised by raising the lower plate 45 to reduce the distance H2. Further, when the measurement result by the pressure measuring mechanism 50 is higher than the set pressure of the plasma processing, the internal pressure of the plasma processing chamber 10 is lowered by lowering the lower plate 45 to increase the distance H2. Thus, the controller 2 compares the pressure detected by the pressure detector 50 with a predetermined set pressure to determine whether the detected pressure is higher and/or lower than the set pressure. Then, the controller 2 controls at least one actuator 46 such that the distance H2 increases when the detected pressure is higher than the set pressure and the distance H2 decreases when the detected pressure is lower than the set pressure. For example, in the example of FIG. 3, the controller 2 lowers the movable annular plate 45 when the detected pressure is higher than the set pressure, and raises the movable annular plate 45 when the detected pressure is lower than the set pressure.

Once the plasma processing for the substrate W is completed, the supply of the radio-frequency power HF and radio-frequency power LF from the RF power supply 31 and the supply of the processing gas by the gas supply 20 are stopped. Further, in a case where the radio-frequency power LF has been supplied during the plasma processing, the supply of the radio-frequency power LF is also stopped. Next, the processing gas is exhausted from the inside of the plasma processing chamber 10 by the exhaust system 40. Next, the supply of the heat transfer gas to the back surface of the substrate W is stopped, and the adsorption and holding of the substrate W by the electrostatic chuck is stopped.

The substrate W on which the plasma processing has been performed is then transferred from the plasma processing chamber 10 to an external device such as a transfer chamber by a substrate transfer mechanism (not illustrated), and a series of plasma processings on the substrate W is completed.

In the plasma processing according to the above-described embodiment, the lower plate 45 is appropriately moved based on the internal pressure of the plasma processing chamber 10 measured by the pressure measuring mechanism 50 in the middle of the plasma processing, but a method of controlling the lower plate 45 is not limited thereto. For example, instead of feedback-controlling an operation of the lower plate 45 based on the internal pressure measured by the pressure measuring mechanism 50 in the middle of the plasma processing, the distance H2 may be changed for each process based on set pressures of various processes which are predetermined before the start of the plasma processing.

For example, in the above-described embodiments, a case where the plasma processing apparatus 1 includes an inductively coupled plasma generator has been described as an example, but a configuration of the plasma generator is not limited thereto. That is, the time require for the pressure control may be appropriately shortened by applying the technique of the present disclosure to various plasma processing apparatuses that are required to shorten the time required for the pressure control.

Example

Hereinafter, an example of the technique according to the present disclosure will be described, but the present technique is not limited to the following example.

The time required for controlling the internal pressure of the plasma processing chamber was measured by the present inventors in a case where the distance H2 is reduced by the above-described exhaust system 400 to reduce likewise the volume of the plasma processing chamber (Example) and in a case where the upper and lower plates 44 and 45 are not included and the volume of the exhaust path 10e is included in the volume of the plasma processing chamber (Comparative Example).

Specifically, in each case of Example and Comparative Example, the processing gas was supplied to the plasma processing space, and the time until the internal pressure of the plasma processing chamber is raised to a desired set pressure was measured.

Figure 10:
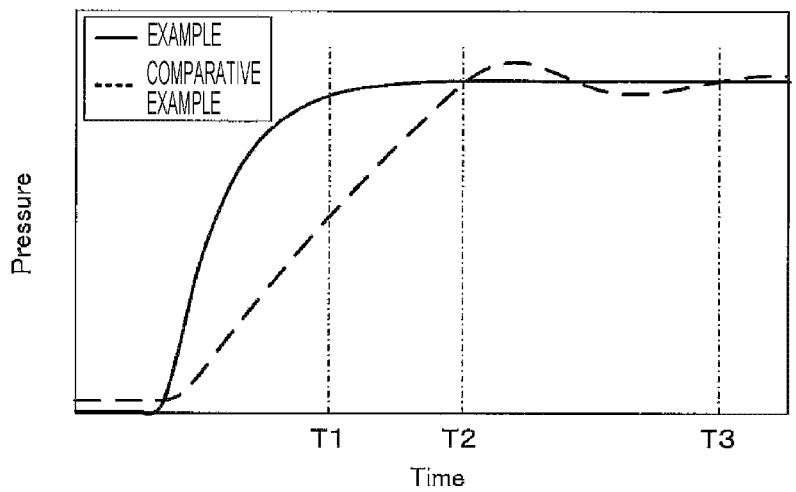
FIG. 10 is an explanatory view illustrating the result of Example of the technique according to the present disclosure.

FIG. 10 is an explanatory view schematically illustrating the result of Example, and is a graph illustrating a relation between the internal pressure (vertical axis) and the time (horizontal axis) when the set pressure is 100 mT and the flow rate of the processing gas supplied to the plasma processing chamber is 300 sccm.

Figure 11:
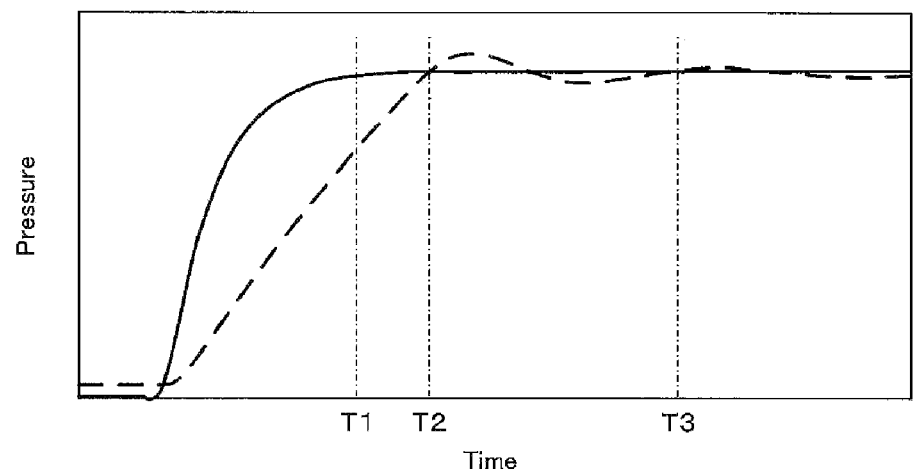
FIG. 11 is an explanatory view illustrating the result of Example of the technique according to the present disclosure.

Further, FIG. 11 is a graph illustrating a relation between the internal pressure (vertical axis) and the time (horizontal axis) when the set pressure is 150 mT and the flow rate of the processing gas supplied to the plasma processing chamber is 500 sccm.

In the drawings, the solid line represents Example, and the broken line represents Comparative Example. Further, the time T1 is a time required to reach the set pressure in Example, the time T2 is a time required to reach the set pressure in Comparative Example, and the time T3 is a time required to be stabilized at the set pressure in Comparative Example.

As illustrated in FIGS. 10 and 11, it can be seen that the time required for the internal pressure to reach the set pressure is shortened by controlling the internal pressure of the plasma processing chamber 10 in a state where the distance H2 between the upper plate 44 and the lower plate 45 is reduced. Specifically, as a result of studies by the present inventors, it could be found by comparing the time T1 and the time T2 that the time required to reach the set pressure in Example may be shortened to about 40% to 50%. Furthermore, it could be found by comparing the time T1 and the time T3 that the time required for stabilization at the set pressure for stably performing the plasma processing may be shortened to about 20% to 30%.

As can be seen from the above results, by arranging the upper and lower plates 44 and 45 functioning as the second pressure adjusting valve in the plasma processing apparatus 1, the time related for the pressure control of the plasma processing chamber 10 may be appropriately shortened.

According to the present disclosure, it is possible to provide a plasma processing apparatus capable of controlling the internal pressure of a processing chamber in a short time.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A plasma processing apparatus, comprising:
   a plasma processing chamber;
   a substrate support disposed in the plasma processing chamber;
   an annular baffle plate disposed so as to surround the substrate support, the annular baffle plate having a plurality of openings;
   a first holeless annular plate disposed below the annular baffle plate and disposed on a sidewall of the plasma processing chamber;
   a second holeless annular plate disposed below the first holeless annular plate, the second holeless annular plate having an annular overlapping portion vertically overlapping with a part of the first holeless annular plate such that an annular gap is formed between the second holeless annular plate and a sidewall of the substrate support, the annular gap having a non-zero width of 1.0 mm or less;
   a pressure detector configured to detect a pressure in the plasma processing chamber; and
   at least one actuator configured to vertically move at least one of the first and second holeless annular plates so as to change a distance between the first holeless annular plate and the second holeless annular plate based on the detected pressure.

2. The plasma processing apparatus according to claim 1, wherein the plurality of openings are shielded by at least one of the first and second holeless annular plates in a plan view.

3. The plasma processing apparatus according to claim 1, further comprising:
   a controller configured to control the at least one actuator such that the distance increases when the detected pressure is higher than a set pressure and the distance decreases when the detected pressure is lower than the set pressure.

4. The plasma processing apparatus according to claim 1, wherein the first holeless annular plate is fixed to a sidewall of the plasma processing chamber or a sidewall of the substrate support, and the at least one actuator is configured to move the second holeless annular plate.

5. The plasma processing apparatus according to claim 4, wherein a distance between the first holeless annular plate and the annular baffle plate is 40 mm or more.

6. The plasma processing apparatus according to claim 4, wherein the first holeless annular plate is fixed to the sidewall of the plasma processing chamber.

7. The plasma processing apparatus according to claim 1, wherein the at least one actuator includes a first actuator configured to move the first holeless annular plate and a second actuator configured to move the second holeless annular plate.

8. The plasma processing apparatus according to claim 1, wherein the annular overlapping portion has a width of 5 mm to 10 mm.

9. The plasma processing apparatus according to claim 1, wherein the first holeless annular plate has a first width, and the second holeless annular plate has a second width larger than the first width.

10. A plasma processing apparatus, comprising:
    a plasma processing chamber;
    a substrate support disposed in the plasma processing chamber;
    an annular baffle plate disposed so as to surround the substrate support, the annular baffle plate having a plurality of openings;
    a first holeless annular plate disposed below the annular baffle plate and secured to a sidewall of the substrate support;
    a second holeless annular plate disposed below the first holeless annular plate, the second holeless annular plate having an annular overlapping portion vertically overlapping with a part of the first holeless annular plate such that an annular gap is formed between the second holeless annular plate and a sidewall of the plasma processing chamber, the annular gap having a non-zero width of 1.0 mm or less;
    a pressure detector configured to detect a pressure in the plasma processing chamber; and
    at least one actuator configured to vertically move the second holeless annular plate so as to change a distance between the first holeless annular plate and the second holeless annular plate based on the detected pressure.

11. The plasma processing apparatus according to claim 10, wherein the plurality of openings are shielded by at least one of the first and second holeless annular plates in a plan view.

12. The plasma processing apparatus according to claim 10, further comprising:
    a controller configured to control the at least one actuator such that the distance increases when the detected pressure is higher than a set pressure and the distance decreases when the detected pressure is lower than the set pressure.

13. The plasma processing apparatus according to claim 10, wherein a distance between the first holeless annular plate and the annular baffle plate is 40 mm or more.

14. The plasma processing apparatus according to claim 10, wherein the annular overlapping portion has a width of 5 mm to 10 mm.

15. The plasma processing apparatus according to claim 10, wherein the first holeless annular plate has a first width, and the second holeless annular plate has a second width larger than the first width.

* * * * *